(12) United States Patent
Cheng et al.

(10) Patent No.: US 9,543,323 B2
(45) Date of Patent: Jan. 10, 2017

(54) STRAIN RELEASE IN PFET REGIONS

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US); Kern Rim, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/595,316

(22) Filed: Jan. 13, 2015

(65) Prior Publication Data

US 2016/0204131 A1 Jul. 14, 2016

(51) Int. Cl.
*H01L 21/8234* (2006.01)
*H01L 27/12* (2006.01)
(Continued)

(52) U.S. Cl.
CPC ....... *H01L 27/1211* (2013.01); *H01L 21/3065* (2013.01); *H01L 21/845* (2013.01);
(Continued)

(58) Field of Classification Search
CPC ........... H01L 29/66545; H01L 29/1054; H01L 29/66795; H01L 29/785; H01L 21/02532
(Continued)

(56) References Cited

U.S. PATENT DOCUMENTS 7,227,205 B2 6/2007 Bryant et al.
7,262,087 B2 8/2007 Chidambarrao et al.
(Continued)

FOREIGN PATENT DOCUMENTS

CN 101341597 A 1/2009
CN 102790004 A 11/2012
(Continued)

OTHER PUBLICATIONS

Donaton et al., Design and Fabrication of MOSFETs with a Reverse Embedded SiGe (Rev. e-SiGe) Structure, Semiconductor R&D Center (SRDC), IBM Systems and Technology Group, Hopewell Junction, NY 12533, International Electron Devices Meeting, IEDM'06, 2006, 4 pages.
(Continued)

*Primary Examiner* — Julia Slutsker
(74) *Attorney, Agent, or Firm* — Nicholas L. Cadmus (57) ABSTRACT

A method for fabricating a semiconductor device, includes providing a strained silicon on insulator (SSOI) structure, the SSOI structure comprises, a dielectric layer disposed on a substrate, a silicon germanium layer disposed on the dielectric layer, and a strained semiconductor material layer disposed directly on the silicon germanium layer, forming a plurality of fins on the SSOI structure, forming a gate structure over a portion of at least one fin in a nFET region, forming a gate structure over a portion of at least one fin in a pFET region, removing the gate structure over the portion of the at least one fin in the pFET region, removing the silicon germanium layer exposed by the removing, and forming a new gate structure over the portion of the at least one fin in the pFET region, such that the new gate structure surrounds the portion on all four sides.

14 Claims, 4 Drawing Sheets

(51) Int. Cl.
  *H01L 21/84* (2006.01)
  *H01L 21/3065* (2006.01)
  *H01L 29/161* (2006.01)
  *H01L 27/092* (2006.01)
  *H01L 29/66* (2006.01)
  *H01L 29/78* (2006.01)

(52) U.S. Cl.
  CPC ........ *H01L 27/0924* (2013.01); *H01L 29/161* (2013.01); *H01L 29/66545* (2013.01); *H01L 29/7849* (2013.01)

(58) Field of Classification Search
  USPC .................................. 438/285, 197, 151, 275
  See application file for complete search history.

(56) References Cited

U.S. PATENT DOCUMENTS

| | | | |
|---|---|---|---|
| 7,271,043 B2 | 9/2007 | Zhu et al. | |
| 7,282,402 B2 | 10/2007 | Sadaka et al. | |
| 7,524,740 B1 | 4/2009 | Liu et al. | |
| 7,575,975 B2 | 8/2009 | Thean et al. | |
| 8,169,025 B2 | 5/2012 | Bedell et al. | |
| 8,486,776 B2 | 7/2013 | Bedell et al. | |
| 8,501,577 B2 | 8/2013 | Bian et al. | |
| 8,946,063 B2 | 2/2015 | Basker et al. | |
| 8,963,248 B2 | 2/2015 | Basker et al. | |
| 2007/0099353 A1 | 5/2007 | Thean et al. | |
| 2007/0117311 A1 | 5/2007 | Zaman | |
| 2008/0135886 A1* | 6/2008 | Irisawa | H01L 21/84 257/255 |
| 2012/0025312 A1* | 2/2012 | Scheiper | H01L 21/823807 257/347 |
| 2013/0071993 A1 | 3/2013 | Bian et al. | |
| 2014/0084342 A1* | 3/2014 | Cappellani | B82Y 10/00 257/192 |
| 2014/0131660 A1* | 5/2014 | Cea | H01L 29/42392 257/24 |
| 2014/0151802 A1 | 6/2014 | Basker et al. | |
| 2014/0151806 A1 | 6/2014 | Basker et al. | |
| 2014/0377917 A1* | 12/2014 | He | H01L 27/0886 438/157 |
| 2015/0243784 A1* | 8/2015 | Morin | H01L 29/7842 257/348 |
| 2015/0372119 A1* | 12/2015 | Zhang | B82Y 10/00 438/268 |

FOREIGN PATENT DOCUMENTS

| | | |
|---|---|---|
| CN | 102790004 B | 6/2014 |
| CN | 103855032 A | 6/2014 |
| JP | 2009514247 A | 4/2009 |
| JP | 5289968 B2 | 9/2013 |
| KR | 1020080070642 A | 7/2008 |
| TW | 200725756 A | 7/2007 |
| WO | 2007053339 A2 | 5/2007 |
| WO | 2007053339 A3 | 5/2007 |
| WO | 2012155833 A1 | 11/2012 |

OTHER PUBLICATIONS

Khakifirooz et al., Strain Engineering for Fully-Depleted SOI Devices, ECS Transactions, 33 (6) 489-499 (2010), 10.1149/1.3487579 © The Electrochemical Society,Downloaded on Apr. 10, 2013 to IP 129.42.208.182 address. Redistribu4ti8o9n subject to ECS license or copyright; see ecsdl.org/site/terms_use.

Kerber et al., Strained SOI FINFET SRAM Design, IEEE Electron Device Letters, vol. 34, No. 7, Jul. 2013, 0741-3106/$31.00 © 2013 IEEE.

Cheng et al., "Strain Release in PFET Regions", U.S. Appl. No. 15/242,992, filed Aug. 22, 2016, 20 pages.

International Searching Authority, "Notification of Transmittal of the International Search Report and the Written Opinion of the International Searching Authority, or the Declaration", Patent Cooperation Treaty, Form PCT/ISA/220 (Jul. 2009), 12 pages, International Application No. IB20161050018, Filed Jan. 4 2016.

* cited by examiner

STRAIN RELEASE IN PFET REGIONS

BACKGROUND OF THE INVENTION

The present invention relates generally to semiconductor devices, and more particularly to utilizing strained silicon-on-insulator (SSOI) substrates for nFET regions with strain release in pFET regions.

A complementary metal oxide semiconductor device (CMOS) uses complementary and symmetrically-oriented pairs of p-type and n-type metal oxide semiconductor field effect transistors (MOSFETs) arranged on silicon or silicon on insulator (SOI) substrates. A MOSFET, which is used for amplifying or switching electronic signals for logic functions, has source and drain regions connected by a channel. The source region is a terminal through which current in the form of majority charge carriers electrons or holes) enters the channel, and the drain region is a terminal through which current in the form of majority charge carriers leaves the channel. In a p-type MOSFET (hereinafter "pFET"), the majority charge carriers are holes that flow through the channel, and in an n-type MOSFET (hereinafter "nFET"), the majority charge carriers are electrons that flow through the channel. A gate overlies the channel and controls the flow of current between the source and drain regions. The channel may be defined by a thin "fin" that provides more than one surface through which the gate controls the flow of current, thereby making the pFETs and nFETs "finFET" devices. Generally, the length of the fin is several orders of magnitude greater than the width.

Substrates used in the fabrication of pFETs and nFETs may comprise strained silicon on insulator (SSOI) substrates. Such substrates generally have intrinsic tensile stresses of several giga-Pascals (GPa), which generally improves electron mobility, thereby improving device performance. The strain in these substrates allows for improvement in device performance without a degradation in electrostatic characteristics even in short-channel finFET devices where the length and the width of the channel is short compared to those of typical planar MOSFETs.

When the global intrinsic stresses in an SSOI substrate exceed a predetermined maximum value (e.g., greater than about 1 GPa), however, the performance of pFET finFET devices may be compromised by 8 to 15%. This is a consequence of hole mobility degradation in the presence of tensile stress in the SSOI substrates. Accordingly, it is desirable to relax the tensile stress in the channels of pFET devices and to improve/restore their performance to the SOI substrate levels. If this can be achieved, nFET devices can be produced having higher performance without degrading the complementary pFET devices.

SUMMARY

Embodiments of the present invention disclose, a method for fabricating a semiconductor device, includes providing a strained silicon on insulator (SSOI) structure, wherein the SSOI structure comprises at least a substrate, a dielectric layer disposed on the substrate, a silicon germanium layer disposed on the dielectric layer, and a strained semiconductor material layer disposed directly on the silicon germanium layer. The method further includes forming a plurality of fins on the SSOI structure by etching the strained semiconductor material layer and the silicon germanium layer down to the dielectric layer, wherein at least one fin of the plurality of fins is in a nFET region of the SSOI structure and at least one fin of the plurality of fins is in a pFET region of the SSOI structure. The method further includes forming a first gate structure over a first portion of the at least one fin of the plurality of fins in the nFET region. The method further includes forming a second gate structure over a second portion of the at least one fin of the plurality of fins in the pFET region, such that the second gate structure surrounds the second portion on three sides. The method further includes removing the second gate structure over the second portion of the at least one fin of the plurality of fins in the pFET region. The method further includes removing the silicon germanium layer exposed by removing the second gate structure over the second portion. The method further includes forming a third gate structure over the second portion of the at least one fin of the plurality of fins in the pFET region, such that the third gate structure surrounds the second portion on all four sides.

Embodiments of the present invention disclose, a semiconductor device, having a strained silicon on insulator (SSOI) structure, wherein the SSOI structure comprises at least a substrate, a dielectric layer disposed on the substrate, a silicon germanium layer disposed on the dielectric layer, and a strained semiconductor material layer disposed directly on the silicon germanium layer. The semiconductor device further includes a plurality of fins on the SSOI structure formed in the strained semiconductor material layer and the silicon germanium layer down, wherein at least one fin of the plurality of fins is in a nFET region of the SSOI structure and at least one fin of the plurality of fins is in a pFET region of the SSOI structure. The semiconductor device further includes a first gate structure over a first portion of the at least one fin of the plurality of fins in the nFET region, wherein the first gate structure surrounds the first portion on three sides, and wherein the silicon germanium layer is disposed between the dielectric layer and a bottom surface of the first portion. The semiconductor device further includes a second gate structure over a second portion of the at least one fin of the plurality of fins in the pFET region, wherein the second gate structure surrounds the second portion on all four sides.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed present invention, as oriented in the drawing figures. The terms "overlying", "underlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Some embodiments of the present invention recognize that for FinFET performance increase a strained channel material is needed. Using a SSOI substrate as starting wafer will yield strained fins. Tensile strained fins (SSOI) are beneficial for nFET devices but not for pFET devices. Therefore there is a need to release the tensile strain in the pFET fins.

Embodiments of the present invention generally provide a structure and method of formation of finFET devices on a strained silicon on insulator (SSOI) substrate having tensile strained fins for nFET devices and relaxed fins for pFET devices. The structure can be formed by selectively etching a sacrificial SiGe layer under the fins in the pFET region.

The present invention will now be described in detail with reference to the Figures.

Figure 1:
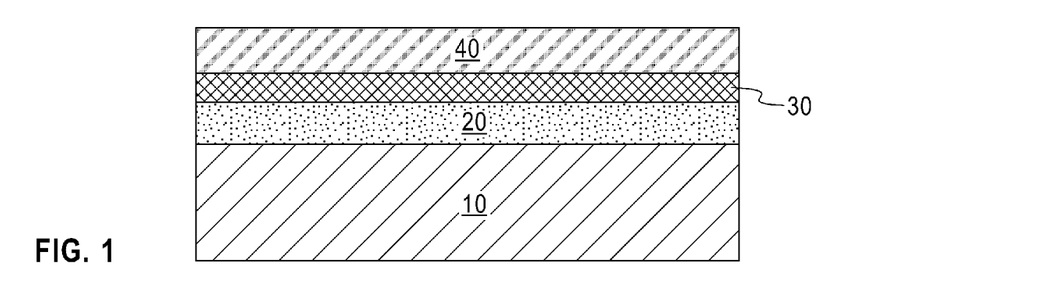
FIG. 1 depicts cross-sectional view of a strained silicon on insulator (SSOI) structure, in accordance with one embodiment of the present invention.

FIG. 1 depicts a cross-sectional view of a strained silicon on insulator (SSOI) structure, in accordance with one embodiment of the present invention. In one embodiment, the SSOI structure includes substrate 10, dielectric layer 20, silicon germanium layer 30, and strained semiconductor material layer 40 for embodiments that include a finFET structure built on an SSOI precursor. In another embodiment, substrate 10, dielectric layer 20, and silicon germanium layer 30 can be replaced by a Thermally Mixed Silicon Germanium on Insulator (TMSGOI) substrate or a strained silicon germanium on insulator (SSGOI) substrate.

Substrate 10 is composed of any conventional semiconductor substrate material. Conventional semiconductor substrate material includes, but is not limited to, silicon (Si), germanium (Ge), silicon germanium (SiGe), silicon carbide, type III-V compound semiconductors, type II-VI compound semiconductors, and combinations and multi-layers thereof.

Overlying the substrate 10 is a dielectric layer 20. Dielectric layer 20 can comprise a buried oxide (BOX) or other dielectric material. BOX material can include any conventional oxide material, e.g., silicon dioxide ($SiO_2$). Dielectric layer 20 has a typical thickness of about 10 nm to about 500 nm. Dielectric layer 20 can be formed by thermally oxidizing the exposed surface of substrate 10, or can be deposited onto substrate 10 using, for example, chemical vapor deposition (CVD) or atomic layer deposition (ALD). As used herein, and unless otherwise noted, the term "depositing" can include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Overlying the dielectric layer 20 is a silicon germanium layer 30. The silicon germanium layer 30 is formed over the dielectric layer 20. The silicon germanium layer 30 is formed atop the dielectric layer 20. Silicon germanium layer 30 is either formed by wafer bonding followed by a known Smart Cut® process or by depositing silicon germanium on a SOI wafer followed by thermal mixing and condensation processes. The Ge content of the silicon germanium layer 30 typically ranges from 5% to 60%, by atomic weight %, with from 25% to 50% being preferred. Typically, the formed silicon germanium layer 30 has a thickness ranging from about 6 nm to about 100 nm, and preferably ranging from 10 nm to 20 nm.

Overlying the silicon germanium layer 30 is a strained semiconductor material layer 40. The strained semiconductor material layer 40 can include silicon, silicon germanium, or any suitable semiconductor material. In one embodiment, the strained semiconductor material layer 40 comprises an epitaxially grown biaxially tensile strained Si-containing material having lattice dimensions that are less than the lattice dimensions of the underlying silicon germanium layer 30. The strained semiconductor material layer 40 can be grown to a thickness that is less than its critical thickness. Typically, the strained semiconductor material layer 40 can be grown to a thickness ranging from about 10 nm to about 100 nm.

Following the formation of the strained silicon on insulator (SSOI) structure depicted in FIG. 1, pFET and nFET "finFET" devices are formed using conventional MOSFET processing steps including, but not limited to: conventional gate oxidation pre-clean and gate dielectric formation; gate conductor formation and patterning; gate reoxidation; source and drain extension formation; sidewall spacer formation by deposition and etching; and source and drain formation. In a typical FinFET fabrication flow, fins are first patterned throughout the wafer, and individual devices are separated once the gate stack, spacer, and raised source/drain structure are formed. Embodiments of the present invention modify or add certain processing steps to conventional MOSFET processing as described below. Some of the conventional MOSFET processing steps have been left out of this discussion for clarity.

Figure 2A:
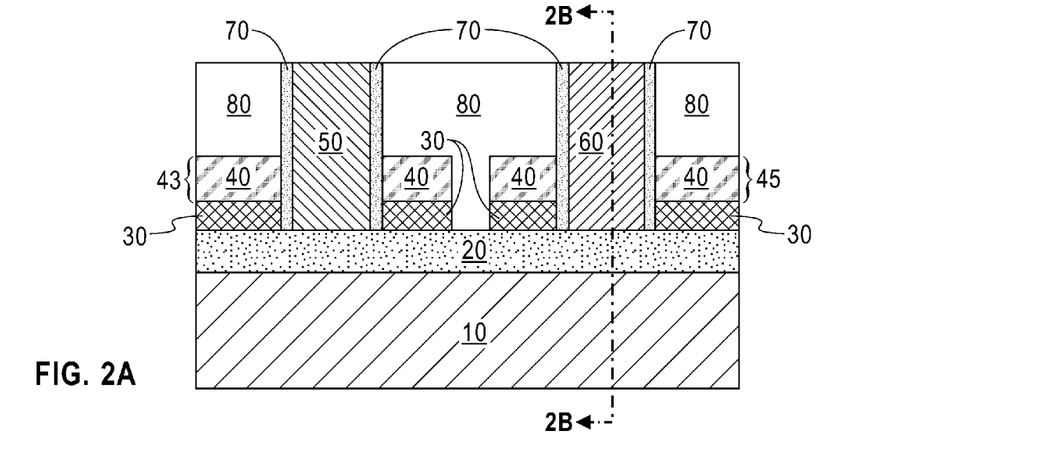
FIG. 2A depicts a cross-sectional view of a nFET device and a pFET device through the region between fins (in the channel direction) perpendicular to the gate structures (parallel to the fins) that have been fabricated from the strained silicon on insulator (SSOI) structure depicted in FIG. 1, in accordance with one embodiment of the present invention.

FIG. 2A depicts a cross-sectional view of a nFET device and a pFET device through the region between fins (in the channel direction) perpendicular to gate structure 50 and gate structure 60 (parallel to fins 43 and 45) that have been fabricated from the strained silicon on insulator (SSOI) structure depicted in FIG. 1, in accordance with one embodiment of the present invention.

Fins 43 and 45 are formed in the strained semiconductor material layer 40 by using lithography and etching the strained semiconductor material layer 40 and the silicon germanium layer 30 down to the dielectric layer 20. The fin 43 is in the nFET region and fin 45 is in the pFET region. Once formed, a thickness of an exemplary fin is about 4 nm to about 20 nm, with 6-10 nm preferred, and a height of an exemplary fin is about 20 nm to about 100 nm, which 30-70 preferred. The length of the fins could range from about 100 nm to a few microns. However, the gate-pitch could be 40 nm to 500 nm. The strained semiconductor material layer 40 and the silicon germanium layer 30 can be etched using a dry etch technique (e.g., plasma dry etching such as reactive ion etching (RIE) or the like or a non-plasma etching technique using, for example, fluorine-containing gas).

Gate regions in the nFET region and in the pFET region are defined by one or more layers stacked transverse to fins 43 and 45, respectively. In forming the gate structures 50 and 60, a gate dielectric material and a gate conductor are deposited between and over fins 43 and 45 and then patterned using lithography and etch steps to define gate stack layers (layers making up gate structure 50 and gate structure 60) that extend transverse to the fins 43 and 45, respectively. In one embodiment, gate structures 50 and 60 can include at least a gate dielectric material and a gate conductor. Gate dielectric material can include, e.g., silicon dioxide, silicon oxynitride, a high-k dielectric, etc. A gate conductor can include polysilicon, metal, a combination of both, etc. The pFET and nFET devices can receive either identical or different gate stacks as desired to set the threshold voltage (Fin 43 is in the nFET region and fin 45 is in the pFET region).

Spacers 70 are formed on opposing sides of gate structure 50 and gate structure 60. Spacers 70 are formed by the deposition and patterning of an insulator material on the sidewalls of gate structure 50 and gate structure 60. Insulator material can be any dielectric material including, but not limited to, SiN, $Si_3N_4$, $SiO_2$, silicon carbon nitride, and the like.

Once gate structures 50 and 60 and spacers 70 are formed, inter-layer dielectric (ILD) layer 80 is formed over the nFET device and the pFET device (e.g., over gate structures 50 and 60, over spacers 70, over fins 43 and 45, over any exposed portions of dielectric layer 20), by any suitable process, such as CVD. ILD layer 80 comprises a dielectric material. The dielectric material can comprise silicon oxide, silicon nitride, silicon oxynitride, spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), Flare, SiLK (Dow Chemical, Midland, Mich.), polyimide, non-porous materials, porous materials, and/or combinations thereof. In some embodiments, ILD layer 80 can include a high density plasma (HDP) dielectric material (e.g., HDP oxide) and/or a high aspect ratio process (HARP) dielectric material (e.g., HARP oxide). ILD layer 80 comprises any suitable thickness. Preferably, ILD layer 80 comprises a thickness of about. It is understood that ILD layer 80 can comprise one or more dielectric materials and/or one or more dielectric layers.

Subsequently, ILD layer 80 is planarized by a chemical mechanical polishing (CMP) process until a top portion of at least gate structure 60 is exposed. In one embodiment, a top surface of ILD layer 80 is coplanar with a top surface of gate structures 50 and 60 and a top surface of spacers 70, as illustrated in FIG. 2A.

Figure 2B:
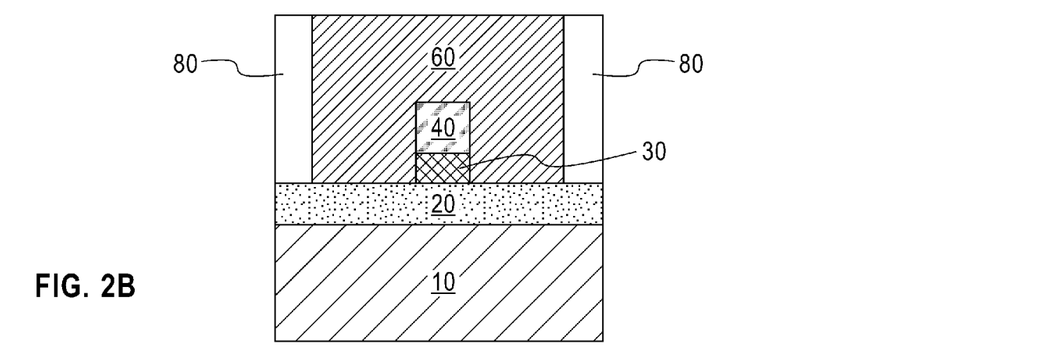
FIG. 2B depicts a cross-sectional view taken through the section line 2B-2B shown in FIG. 2A, depicting a pFET device, through the gate structure, perpendicular to the fin, in accordance with one embodiment of the present invention.

FIG. 2B depicts a cross-sectional view taken through the section line 2B-2B shown in FIG. 2A, depicting a pFET device, through gate structure 60, perpendicular to fin 45 (e.g., silicon germanium layer 30 and strained semiconductor material layer 40), in accordance with one embodiment of the present invention. FIG. 2B depicts gate structure 60 surrounding fin 45 (e.g., silicon germanium layer 30 and strained semiconductor material layer 40) on three sides. Fin 45 is shown currently comprised of silicon germanium layer 30 and strained semiconductor material layer 40.

Figure 3A:
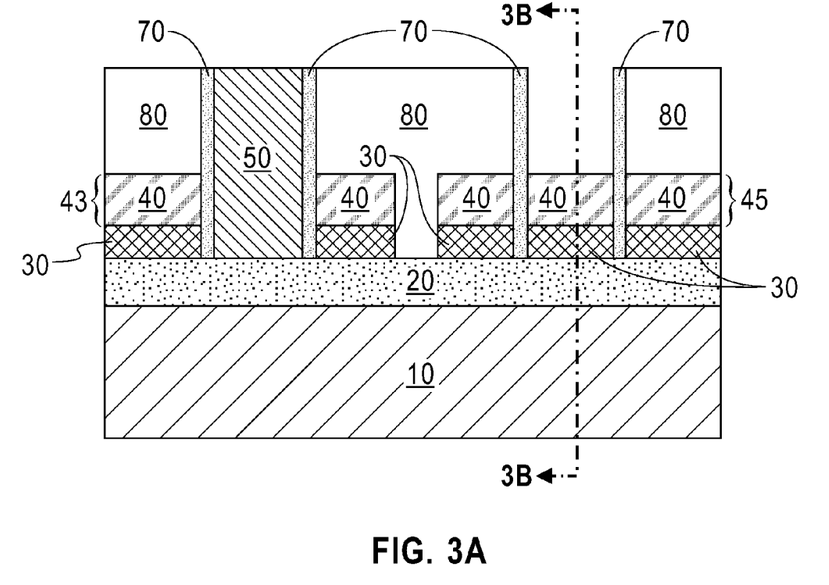
FIG. 3A depicts a cross-sectional view of a nFET device and a pFET device through the region between fins (in the channel direction) perpendicular to the gate structure of the nFET device (parallel to the fins) after the gate structure of the pFET device has been removed, in accordance with one embodiment of the present invention.

FIG. 3A depicts a cross-sectional view of the nFET device and the pFET device of FIG. 2A, through the region between fins (in the channel direction) perpendicular to gate 50 (parallel to fins 43 and 45), after gate structure 60 has been removed, in accordance with one embodiment of the present invention.

In one embodiment, gate structure 60 is removed using a replacement metal gate process. The removal process is performed to etch gate structure 60 and remove it entirely. As shown in FIG. 3A, the removal of gate structure 60 forms a gate trench between sidewall spacers 70 exposing a portion of fin 45 (e.g., portions of strained semiconductor material layer 40 and silicon germanium layer 30) covered by gate structure 60. Dielectric layer 20 acts as an etch stop layer.

Conventional techniques can be employed for removing gate structure 60. In one embodiment, a mask (not shown) is deposited over the nFET region (e.g., over to protect gate structure 50 while leaving the top surface of gate structure 60 exposed. In one embodiment, the mask is a nitride hardmask. In various embodiments, the mask can be silicon nitride (SiN) with a typical thickness of about 10 nm, deposited using, for example, low pressure chemical vapor deposition (LPCVD). In other embodiments, the mask can be any mask material that can act as an etch mask during the removal of gate structure 60 (e.g., a nitride, oxide/nitride stack, titanium nitride, silicon nitride, silicon dioxide, silicon carbide, silicon carbide nitride, etc.).

In one embodiment, after protecting gate structure 50, exposed gate structure 60 is removed using a wet chemical etch, such as TMAH, or a dry etch such as RIE, exposing dielectric layer 20, the sidewalls of spacers 70, and a portion of strained semiconductor material layer 40 and a portion of silicon germanium layer 30. A person of ordinary skill in the art will recognize that the type of etching used will depend on the material of which gate structure 60 are composed, other etch processes, e.g., wet chemical etch, laser ablation, etc., can be used.

Figure 3B:
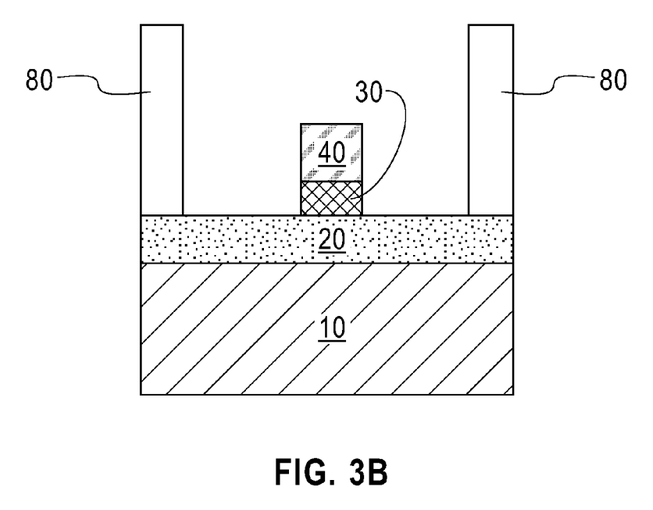
FIG. 3B depicts a cross-sectional view taken through the section line 3B-3B shown in FIG. 3A, depicting a pFET device, through a gate trench formed by the removal of the gate structure, perpendicular to the fin, in accordance with one embodiment of the present invention.

FIG. 3B depicts a cross-sectional view taken through the section line 3B-3B shown in FIG. 3A, depicting a pFET device, through a gate trench formed by the removal of gate structure 60, perpendicular to fin 45 (e.g., silicon germanium layer 30 and strained semiconductor material layer 40), in accordance with one embodiment of the present invention. FIG. 3B depicts a gate trench formed by the removal of gate structure 60. Fin 45 (e.g., silicon germanium layer 30 and strained semiconductor material layer 40) is now exposed on three sides. Fin 45 is shown currently comprised of silicon germanium layer 30 and strained semiconductor material layer 40.

Figure 4A:
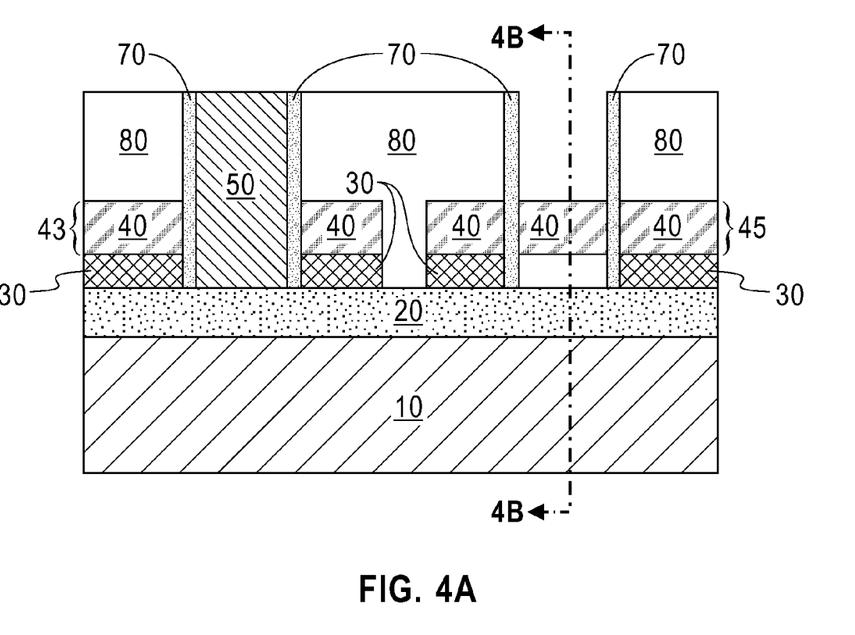
FIG. 4A depicts a cross-sectional view of the nFET device and the pFET device of FIG. 3A, through the region between fins (in the channel direction) perpendicular to the gate structure of the nFET device (parallel to the fins), after the portion of the silicon germanium layer exposed by the removal of the gate structure of the pFET device has been removed, in accordance with one embodiment of the present invention.

FIG. 4A depicts a cross-sectional view of the nFET device and the pFET device of FIG. 3A, through the region between fins (in the channel direction) perpendicular to gate 50 (parallel to fins 43 and 45), after the portion of silicon germanium layer 30 exposed by the removal of gate structure 60 has been removed, in accordance with one embodiment of the present invention.

In one embodiment, the portion of silicon germanium layer 30 exposed by the removal of gate structure 60 is removed. The portion of silicon germanium layer 30 exposed by the removal of gate structure 60 can be removed from beneath strained semiconductor material layer 40 using, for example an HCl gas etch process. The removal of the portion of silicon germanium layer 30 exposes a bottom surface of the portion of strained semiconductor material layer 40 exposed by the removal of gate structure 60.

Figure 4B:
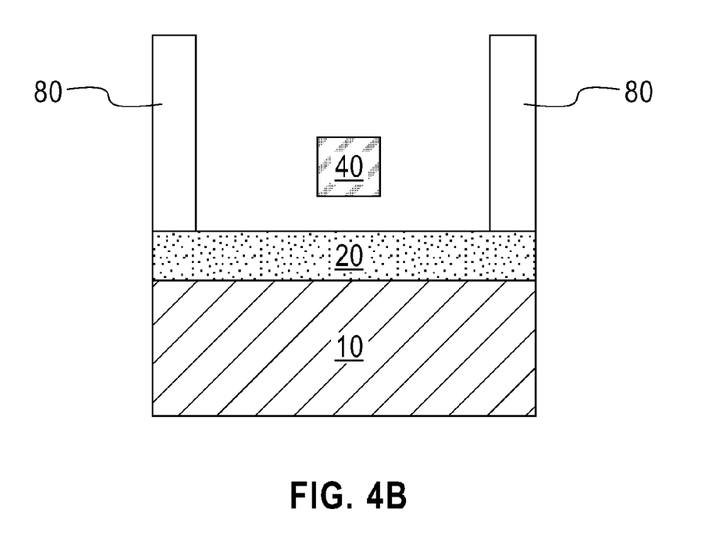
FIG. 4B depicts a cross-sectional view taken through the section line 4B-4B shown in FIG. 4A, depicting a pFET device, through the gate trench after the portion of the silicon germanium layer exposed by the removal of the gate structure has been removed, perpendicular to the fin, in accordance with one embodiment of the present invention.

FIG. 4B depicts a cross-sectional view taken through the section line 4B-4B shown in FIG. 4A, depicting a pFET device, through the gate trench after the portion of silicon germanium layer 30 exposed by the removal of gate structure 60 has been removed, perpendicular to fin 45 (e.g., strained semiconductor material layer 40), in accordance with one embodiment of the present invention. FIG. 4B depicts the gate trench after the portion of silicon germanium layer 30 exposed by the removal of gate structure 60 has been removed. Fin 45 (e.g., strained semiconductor material layer 40) is now exposed on all four sides. Fin 45 is shown now comprised of strained semiconductor material layer 40. Additionally, the four sides of fin 45 are exposed by the removal of the portion of silicon germanium layer 30 exposed by the removal of gate structure 60, creating a fin that extends through the gate trench.

Figure 5A:
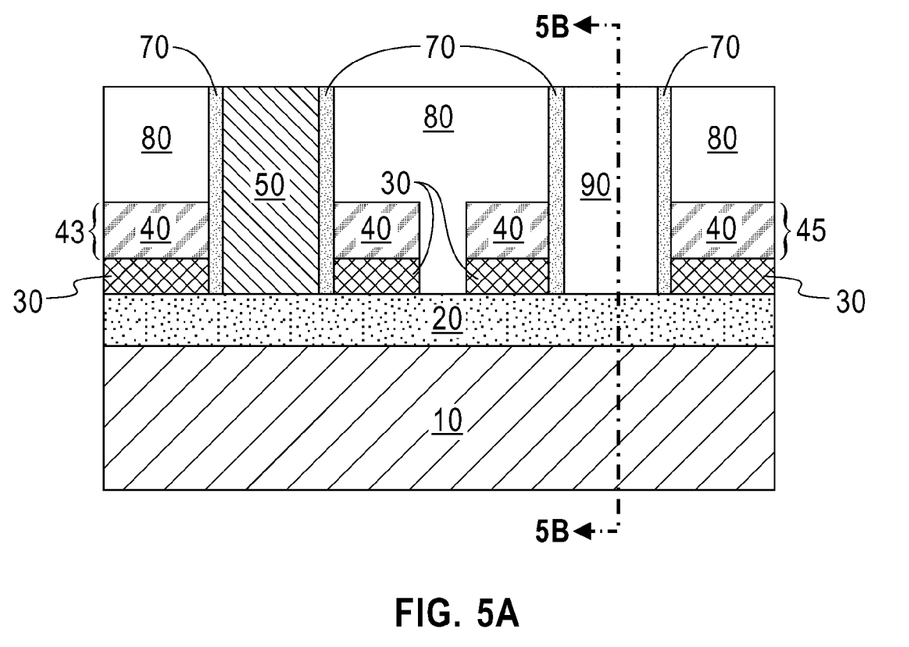
FIG. 5A depicts a cross-sectional view of the nFET device and the pFET device of FIG. 4A, through the region between fins (in the channel direction) perpendicular to the gate structure of the nFET device (parallel to the fins), after the formation of a new gate structure in the pFET device, in accordance with one embodiment of the present invention.

FIG. 5A depicts a cross-sectional view of the nFET device and the pFET device of FIG. 4A, through the region between fins (in the channel direction) perpendicular to gate 50 (parallel to fins 43 and 45), after the formation of gate structure 90, in accordance with one embodiment of the present invention.

In one embodiment, gate structure 90 comprises a stack of materials, known to someone skilled in the art, deposited, using, for example, CVD or ALD, and can include a high-k dielectric material. In various embodiments, formation of gate structure 90 includes the deposition of gate dielectric material. In one embodiment, gate dielectric material is composed of a high-k dielectric material including without limitation hafnium dioxide ($HfO_2$), hafnium silicates ($HfSiO_x$), aluminum oxide ($Al_2O_3$), zirconium oxide ($ZrO_3$), or lanthanum oxide ($La_2O_3$). Gate dielectric material is deposited on the surface of ILD layer 80, the exposed tops and sidewall surfaces of spacers 70, the exposed portion of dielectric layer 20, and the four sides of the exposed portion of fin 45 (e.g., strained semiconductor material layer 40).

In one embodiment, gate structure 90 includes workfunction setting metal and gate conductor material. The workfunction setting metal can be a material such as titanium nitride (TiN) or tantalum nitride (TaN) deposited over the gate dielectric material. It should be appreciated by one skilled in the art that the selection and use of a workfunction setting metal is based on the desired electrical characteristics of the finFET device. The gate conductor material is deposited over the workfunction setting metal, filling the gate trench with, for example, tungsten (W) or aluminum (Al). The various layers and materials of gate structure 90 are presented as examples and are not meant to be limiting.

Excess materials used to form gate structure 90 can be removed from the surface of ILD layer 80. For example, CMP can be used to remove the excess materials used to form gate structure 90 that include gate dielectric material, the workfunction setting metal, and the gate conductor material. The result is gate structure 90 that is buried beneath, and surrounds, on four sides, a portion of fin 45 (e.g., strained semiconductor material layer 40).

In another embodiment, gate structure 90 includes a flowable oxide portion. The flowable oxide portion is disposed between dielectric layer 20 and a bottom surface of the exposed portion of fin 45 (e.g., strained semiconductor material layer 40). In one embodiment, flowable oxide can be any type of flowable oxide that is capable of filling the bottom of the gate trench up to the height of the bottom surface of the exposed portion of fin 45 (e.g., strained semiconductor material layer 40). The result is gate structure 90 with a portion (flowable oxide) that is buried beneath a portion of fin 45 (e.g., strained semiconductor material layer 40), and another portion that surrounds the portion of fin 45 on three sides.

Figure 5B:
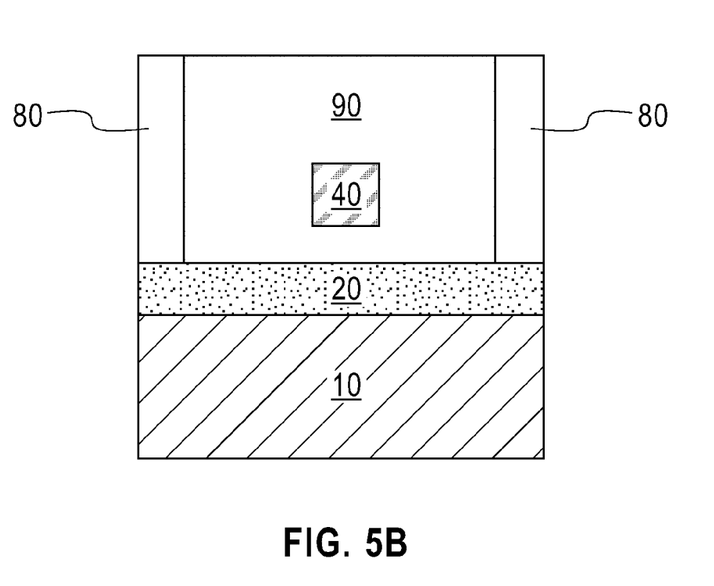
FIG. 5B depicts a cross-sectional view taken through the section line 5B-5B shown in FIG. 5A, depicting a pFET device, through the gate trench after the formation of a new gate structure, perpendicular to the fin, in accordance with one embodiment of the present invention.

FIG. 5B depicts a cross-sectional view taken through the section line 5B-5B shown in FIG. 5A, depicting a pFET device, through the gate trench after the formation of gate structure 90, perpendicular to fin 45 (e.g., strained semiconductor material layer 40), in accordance with one embodiment of the present invention. FIG. 5B depicts the gate trench after the formation of gate structure 90. Fin 45 (e.g., strained semiconductor material layer 40) is now surrounded on all four sides by gate structure 90. In another embodiment, gate structure 90 has a portion (flowable oxide) that is buried beneath a portion of fin 45 (e.g., strained semiconductor material layer 40), and another portion that surrounds the portion of fin 45 on three sides.

What is claimed is:

1. A method for fabricating a semiconductor device, comprising:
   providing a strained silicon on insulator (SSOI) structure, wherein the SSOI structure comprises at least a substrate, a dielectric layer disposed on the substrate, a silicon germanium layer disposed on the dielectric layer, and a strained semiconductor material layer disposed directly on the silicon germanium layer;
   forming a plurality of fins on the SSOI structure by etching the strained semiconductor material layer and the silicon germanium layer down to the dielectric layer, wherein at least one fin of the plurality of fins is in a nFET region of the SSOI structure and at least one fin of the plurality of fins is in a pFET region of the SSOI structure;
   forming a first gate structure over a first portion of the at least one fin of the plurality of fins in the nFET region;
   forming a second gate structure over a second portion of the at least one fin of the plurality of fins in the pFET region, such that the second gate structure surrounds the second portion on three sides;
   removing the second gate structure over the second portion of the at least one fin of the plurality of fins in the pFET region;
   removing the silicon germanium layer exposed by the removal of the second gate structure over the second portion, wherein the removal of the silicon germanium layer exposed by the removal of the second gate structure releases strain in the at least one fin of the plurality of fins in the pFET region; and
   forming a third gate structure over the second portion of the at least one fin of the plurality of fins in the pFET region, such that the third gate structure surrounds the second portion on all four sides.

2. The method of claim 1, wherein a germanium content of the silicon germanium layer is in a range from 5% to 60% by atomic weight percentage.

3. The method of claim 1, wherein a germanium content of the silicon germanium layer is in a range from 25% to 50% by atomic weight percentage.

4. The method of claim 1, wherein the silicon germanium layer has a thickness in a range from about 5 nm to about 100 nm.

5. The method of claim 1, wherein the silicon germanium layer has a thickness in a range from about 10 nm to 20 nm.

6. The method of claim 1, wherein the silicon germanium layer is disposed on the dielectric layer by a wafer bonding process.

7. The method of claim 1, wherein the substrate and the dielectric layer are components of a silicon on insulator (SOI) substrate, and wherein the silicon germanium layer is formed by depositing silicon germanium on the SOI substrate followed by thermal mixing and condensation processes.

8. The method of claim 1, wherein the dielectric layer comprises a buried oxide (BOX).

9. The method of claim 1, wherein the dielectric layer comprises silicon dioxide.

10. The method of claim 1, wherein the removing the silicon germanium layer exposed by the removal of the second gate structure over the second portion comprises:
    etching the silicon germanium layer exposed by the removal of the second gate structure over the second portion using an HCl gas etch.

11. The method of claim 1, wherein the substrate comprises one or more of the following: silicon; germanium; silicon germanium; silicon carbide; type III-V compound semiconductors; type II-VI compound semiconductors; and combinations and multi-layers thereof.

12. The method of claim 1, wherein the plurality of fins have a thickness in a range from about 6 nm to about 10 nm.

13. The method of claim 1, wherein the plurality of fins have a height in a range from 30 nm to 70 nm.

14. The method of claim 1, wherein the third gate structure comprises a flowable oxide portion, wherein the flowable oxide portion is disposed between the dielectric layer and a bottom surface of the second portion of the at least one fin of the plurality of fins in the pFET region.

* * * * *